United States Patent
Liikanen et al.

(10) Patent No.: US 10,446,241 B1
(45) Date of Patent: Oct. 15, 2019

(54) AUTOMATIC CALIBRATION (AUTOCAL) ERROR RECOVERY FOR A MEMORY SUB-SYSTEM

(71) Applicant: Micron Technology, Inc., Boise, ID (US)

(72) Inventors: Bruce A. Liikanen, Berthoud, CO (US); Gerald L. Cadloni, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/102,067

(22) Filed: Aug. 13, 2018

(51) Int. Cl.
| | |
|---|---|
| *G11C 16/34* | (2006.01) |
| *G11C 29/52* | (2006.01) |
| *G11C 16/26* | (2006.01) |
| *G06F 9/30* | (2018.01) |
| *G11C 7/18* | (2006.01) |
| *G11C 8/14* | (2006.01) |
| *G11C 16/04* | (2006.01) |

(52) U.S. Cl.
CPC ........ *G11C 16/3404* (2013.01); *G06F 9/3004* (2013.01); *G11C 7/18* (2013.01); *G11C 8/14* (2013.01); *G11C 16/0483* (2013.01); *G11C 16/26* (2013.01); *G11C 29/52* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 10,140,040 B1 * | 11/2018 | Koudele | G06F 3/0619 |
| 2003/0103395 A1 * | 6/2003 | Ooishi | G11C 7/062 |
| | | | 365/201 |
| 2010/0296350 A1 * | 11/2010 | Kim | G11C 11/5642 |
| | | | 365/189.15 |
| 2011/0228604 A1 * | 9/2011 | Eli | G11C 11/5628 |
| | | | 365/185.09 |
| 2013/0061101 A1 * | 3/2013 | Fitzpatrick | G11C 16/349 |
| | | | 714/718 |
| 2013/0094290 A1 * | 4/2013 | Sridharan | G11C 16/0483 |
| | | | 365/185.03 |
| 2014/0056066 A1 * | 2/2014 | Baum | G11C 7/065 |
| | | | 365/185.03 |
| 2014/0143630 A1 * | 5/2014 | Mu | G06F 11/1048 |
| | | | 714/763 |
| 2015/0205664 A1 * | 7/2015 | Janik | G06F 11/1012 |
| | | | 714/764 |

* cited by examiner

*Primary Examiner* — Douglas King
(74) *Attorney, Agent, or Firm* — Perkins Coie LLP

(57) ABSTRACT

Several embodiments of memory devices and systems with walking read level calibration are disclosed herein. In one embodiment, a system includes a memory component having at least one memory region and calibration circuitry. The memory region has memory cells that read out data states in response to application of a current read level signal. The calibration circuitry is operably coupled to the at least one memory region and is configured to perform iterative calibrations of the memory region by determining a first read level offset value during a first calibration. A new base read level test signal is determined based on the first read level offset value. During a second calibration using the new base read level test signal, a second read level offset value is determined.

20 Claims, 8 Drawing Sheets

450

| Applied Voltage | Bit Count | Count Difference | |
|---|---|---|---|
| $V_{L2}$ | 586 | 52 | ← $cd_1$ |
| $V_{L1}$ | 534 | | |
| $V_{L1}$ | 534 | 41 | ← $cd_2$ |
| $V_A$ | 493 | | |
| $V_A$ | 493 | 26 | ← $cd_3, m$ |
| $V_{U1}$ | 467 | | |
| $V_{U1}$ | 467 | 55 | ← $cd_4$ |
| $V_{U2}$ | 411 | | |

470

| Voltage Range | Count Difference | Relative Difference |
|---|---|---|
| $cd_1$ | 52 | 26 |
| $cd_3$ | 26 | |
| $cd_2$ | 41 | 15 |
| $cd_3$ | 26 | |
| $cd_3$ | 26 | -29 |
| $cd_4$ | 55 | |

AUTOMATIC CALIBRATION (AUTOCAL) ERROR RECOVERY FOR A MEMORY SUB-SYSTEM

RELATED APPLICATION(S)

This application contains subject matter related to a concurrently-filed U.S. patent application by Bruce A. Liikanen et al. titled "OFFSET MEMORY COMPONENT AUTOMATIC CALIBRATION (AUTOCAL) ERROR RECOVERY FOR A MEMORY SUB-SYSTEM." The related application is assigned to Micron Technology, Inc., and is identified by Ser. No. 16/102,092.

TECHNICAL FIELD

The disclosed embodiments relate to memory sub-systems, and, in particular, to automatic calibration error recovery for a memory sub-system.

BACKGROUND

Memory devices can employ flash media to persistently store large amounts of data for a host device, such as a mobile device, a personal computer, or a server. Flash media includes "NOR flash" and "NAND flash" media. NAND-based media is typically favored for bulk data storage because it has a higher storage capacity, lower cost, and faster write speed than NOR media. The memory cells in NAND flash employ a charge storage structure, (e.g., a floating gate structure or a charge trapping structure) for storing charge to represent different data states. The cells are programmed by transferring electrons through a thin dielectric layer (e.g., a tunnel oxide) from a channel to, e.g., a floating gate or a charge trapping layer within the charge storage structure. The amount of charge stored in a memory cell represents one or more threshold voltages that are indicative of the voltage(s) required to form a conductive path within the channel, (e.g., depending on the amount of electrons stored on the floating gate or the charge trapping layer).

One drawback of flash memory and other non-volatile memory is that the threshold voltages of the individual memory cells can change as, over time, the memory device erases and writes data to the memory. For example, over multiple erase and write cycles, electrons can become trapped within the tunnel oxide of a memory cell, causing the threshold voltage(s) of the cell to gradually increase. This phenomenon, if uncorrected, can result in bit errors during a read of the data stored in the memory cell.

In some circumstances, error correcting code (ECC) techniques may be employed to detect and correct bit errors if the number of bit errors does not exceed the correction capacity of the code. Eventually, however, as more electrons are trapped within the tunnel oxide layers of more and more memory cells in a memory device, the number of memory cells with unreadable data states (e.g., due to shifted threshold voltages) may exceed the correction capacity of the ECC. When this happens, the memory controller is no longer able to efficiently or properly read out data from the affected memory regions.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
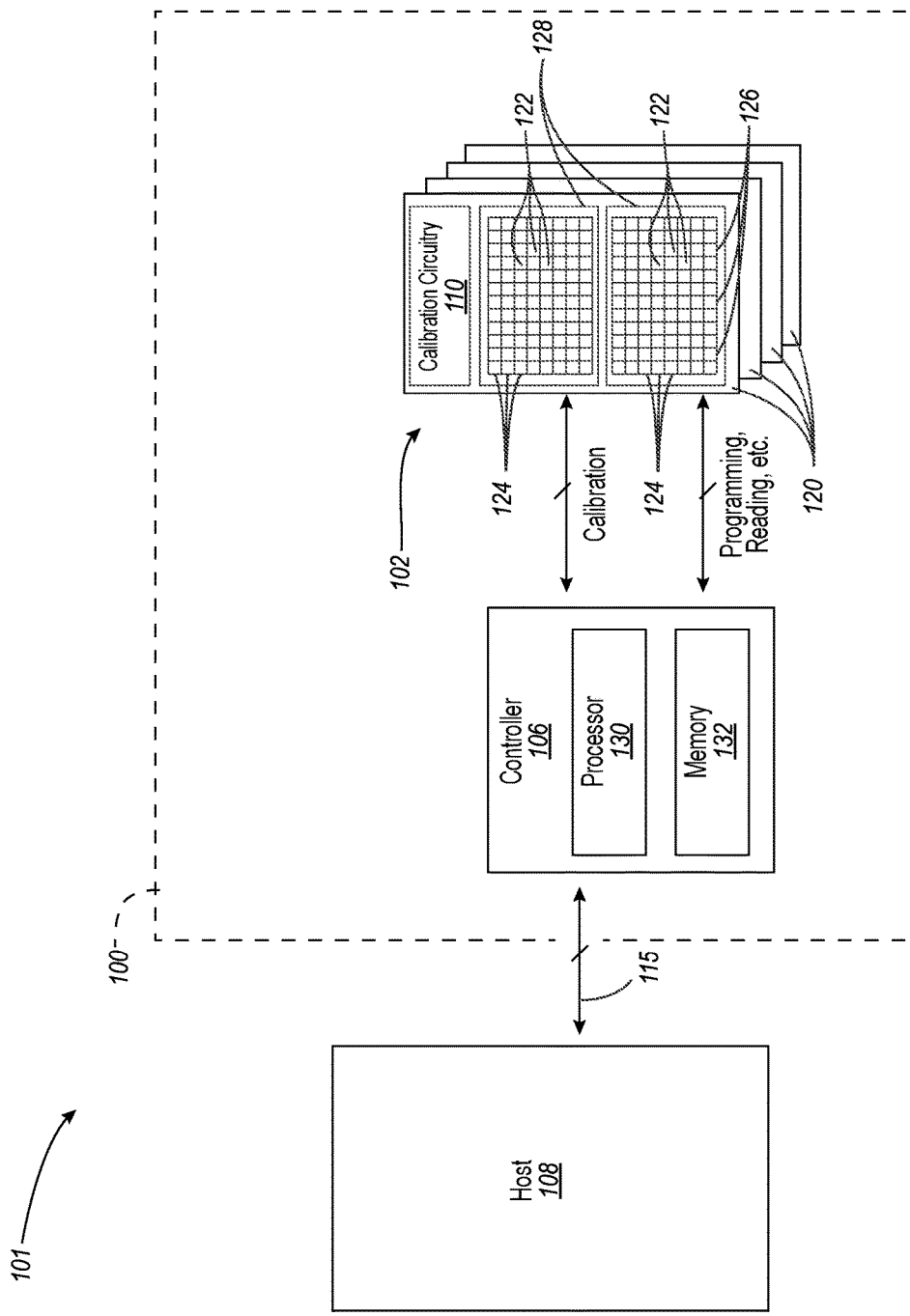
FIG. 1 is a block diagram of a system having a memory device configured in accordance with an embodiment of the present technology.

As described in greater detail below, the present technology relates to memory devices and related systems with a walking read level calibration. A person skilled in the art, however, will understand that the technology may have additional embodiments and that the technology may be practiced without several of the details of the embodiments described below with reference to FIGS. 1-6. In the illustrated embodiments below, the memory devices are described in the context of devices incorporating NAND-based storage media (e.g., NAND flash). Memory devices configured in accordance with other embodiments of the present technology, however, can include other types of memory devices and/or can include main memories that are not NAND-based (e.g., NOR-based) or only partially NAND-based.

One embodiment of the present technology is a system comprising a memory component comprising a memory region having a plurality of memory cells configured to read out data states in response to application of a current read level signal. The system also includes calibration circuitry operably coupled to the memory region. The calibration circuitry is configured to (1) measure, for a portion of the memory region, first performance characteristics for each of a plurality of read level test signals comprising a first base read level test signal; (2) determine a first read level offset value corresponding to one or more of the plurality of read level test signals based on the measured first performance characteristics; (3) determine, based on the first read level offset value, a second base read level test signal; (4) measure, for the portion of the memory region, second performance characteristics for each of a second plurality of read level test signals comprising the second base read level test signal; and (5) determine a second read level offset value corresponding to one or more of the second plurality of read level test signals based on the measured second performance characteristics.

A read level offset value may be used to update a corresponding current read level signal for a portion of a memory region. In this manner, the current read level signals for the memory component of the memory device can be calibrated to account for shifts in the threshold voltages in the memory cells of the memory component, which, in turn, decreases the occurrence of bit errors and increases the life of the memory device. In some instances, shifts in threshold voltages may be relatively large, such that utilizing read level test signals at, around, or near a current read level signal may not yield a better or optimal read level offset value. Accordingly, as described herein, multiple iterative calibrations, a walking read level calibration, can be performed to determine a new read level offset value with which to adjust a current read level signal. This can effectively increase the range of read level test voltages that a memory system can use for calibration an increase the capability of a memory device to correct for errors. In various embodiments disclosed herein, the multiple calibration steps are performed atomically without any erase, program, and/or read operation occurring between the atomic calibration steps. In this way, the calibration can utilize a first calibration step output as a starting point for a second calibration step. This process can be repeated N times (e.g., N=4) until a read level offset value is output, which can be used to update a current read level signal.

FIG. 1 is a block diagram of a system 101 having a memory sub-system (also hereinafter referred to as a "memory device" (e.g., memory device 100)) configured in accordance with an embodiment of the present technology. An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. As shown, the memory device 100 includes one or more memory components (e.g., memory component 102 (e.g., NAND flash)) and a controller 106 operably coupling the memory component 102 to a host device 108 (e.g., an upstream central processor (CPU)). The memory component 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, floating gate, charge trap, phase change, ferroelectric, magnetoresistive, and/or other suitable storage elements configured to store data persistently or semi-persistently. The memory component 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Furthermore, adjacent word lines 124 can be arranged into one or more word line groups that compose a memory block 128. Each word line 124 can span one or more memory pages, depending upon the number of data states the memory cells 122 of that word line 124 are configured to store. For example, a single word line 124 of memory cells 122 in which each memory cell 122 stores one of two data states (e.g., SLC memory cells configured to store one bit each) can span a single memory page. Alternatively, a single word line 124 of memory cells 122 in which each memory cell 122 stores one of four data states (e.g., MLC memory cells configured to store two bits each) can span two memory pages. Moreover, memory pages can be interleaved so that a word line 124 comprised of memory cells 122 configured to store one of two data states in each cell (e.g., SLC memory cells) can span two memory pages, in an "even-odd bit line architecture," where all the memory cells 122 in odd-numbered columns 126 of a single word line 124 are grouped as a first memory page, and all the memory cells 122 in even-numbered columns 126 of the same word line 124 are grouped as a second memory page. When even-odd bit line architecture is utilized in a word line 124 of memory cells 122 that store larger numbers of data states in each cell (e.g., memory cells configured as MLC, TLC, QLC, etc.), the number of memory pages per word line 124 can be even higher (e.g., 4, 6, 8, etc.).

Each column 126 can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of groups and/or hierarchies than those shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory device 100 can include only one memory unit 120. Alternatively, memory device 100 can include two, three, four, eight, ten, or more (e.g., 16, 12, 64, or more) memory units 120. While the memory units 120 are shown in FIG. 1 as including two memory blocks 128 each, in other embodiments, each memory unit 120 can include one, three, four eight, or more (e.g., 16, 32, 64, 100, 128, 256 or more memory blocks). In some embodiments, each memory block 128 can include, e.g., $2^{15}$ memory pages, and each memory page within a block can include, e.g., $2^{12}$ memory cells 122 (e.g., a "4k" page).

The memory component 102 further includes a calibration component, or calibration circuitry 110 (shown schematically), operably coupled to at least one of the memory units 120. In some embodiments, the calibration circuitry 110 can be located on the same memory die as an individual memory unit 120. In these and other embodiments, the calibration circuitry 110 may be dedicated to a corresponding memory unit 120 or multiple memory units, including memory units on different die. The calibration circuitry 110 can include circuit components, such as multiplexers, decoders, buffers, read/write drivers, address registers, data out/data in registers, etc. In some embodiments, the calibration circuitry 110 can be circuitry separate from other on-chip circuitry used for accessing and/or programming (e.g., reading and/or writing) the memory cells 122 and/or for providing other functionality, such as for processing information and/or communication with the controller 106. The calibration circuitry 110 is configured to implement the walking NAND autocal devices, systems, methods, and computer readable medium with executable instructions as described herein.

The calibration circuitry 110 can be separate from the memory component 102, or can be incorporated within the controller 106, the host 108, or another device. Various aspects of the calibration circuitry 110 may also exist on different devices including the memory component 102, the controller 106, the host 108, or another device. Accordingly, the methods and functionalities discussed herein associated with the calibration circuitry 110 may be performed in whole or in part by or at any combination of the memory component 102, the controller 106, the host 108, or another device. Other devices may be connected to the memory component 102, the controller 106, and/or the host 108 through a network, for example. Other devices may be other memory devices, a computing device configured to manage and communicate with memory devices, or another type of computing device.

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the memory component 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. While the exemplary memory device 100 illustrated in FIG. 1 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the memory component 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 0).

The controller 106 communicates with the host device 108 over a host-device interface 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

The controller 106 can also calibrate signals used to program and read from the memory component 102. In various embodiments described below, the controller 106 can send a calibration signal including to the calibration circuitry 110 to instruct the calibration circuitry 110 to self-calibrate one or more memory regions of the memory component 102, which can improve or optimize the signaling (e.g., voltage signaling) used to read the data state of the individual memory cells 122, such as a selected group of memory cells 122 (e.g., multiple memory cells associated with a memory page, multiple memory pages associated with a word line, multiple word lines associated with a word line group, etc.). As described herein, that calibration signal can include a walking automatic calibration (autocal) command, which instructs the calibration circuitry 110 to perform multiple iterative calibration steps are taken one after another without the controller erasing, reading, and/or writing to the memory cells 122 in between the multiple iterative calibration steps. This walking autocal process can advantageously be used to correct errors in a memory component that may not be correctable using a single calibration step.

Figure 2:
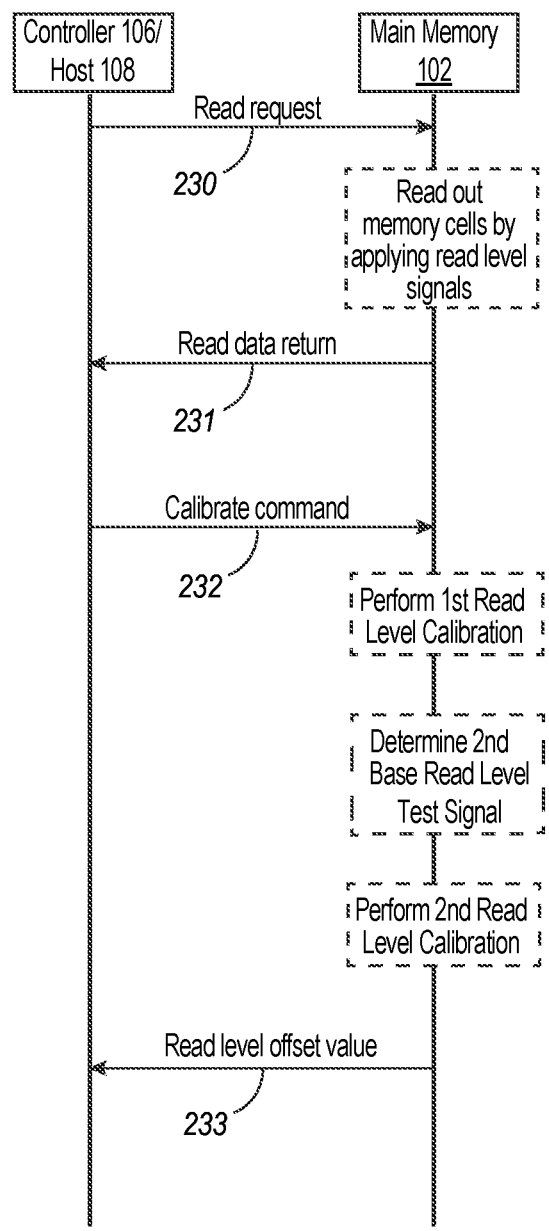
FIG. 2 is a message flow diagram illustrating various data exchanges between components of a memory device in accordance with an embodiment of the present technology.

FIG. 2 is a message flow diagram illustrating various data exchanges between the memory component 102 (FIG. 1) and the controller 106 (FIG. 1) of the memory device 100 (FIG. 1) and/or the host device 108 (FIG. 1) in accordance with one embodiment of the present technology. The controller 106 can read from the memory component 102 by sending a read request 230 to the memory component 102. The read request 230 can include physical addresses of one or more memory regions within the memory component 102 and/or read level signals (e.g., read level voltages) of those memory regions. In response to the read request 230, the memory component 102 can apply the read level signals to the corresponding memory regions and read out data states stored on the memory cells 122 (FIG. 1) within the memory regions. The memory component 102 can return the data states of the memory cells 122 to the controller 106 in a read data return message 231.

The controller 106 can also periodically calibrate the read level signals of one or more select memory regions within the memory component 102 according to the embodiments described herein. The read level signals may be periodically calibrated to account for, e.g., a shift of one or more threshold voltages of memory cells within the memory regions. To calibrate the read level signals of selected memory regions within the memory component 102, the controller 106 can send a calibrate command 232 to the calibration circuitry 110. The calibrate command 232 can include physical addresses of the selected memory regions and/or current read level signals (e.g., default read level signals and/or previously calibrated read level signals) of the selected memory regions, which can be used as a first base read level test signal for a first calibration step. Alternatively, the controller may not provide the read level signal, in which case the calibration circuitry 110 can utilize a previously-stored read level signal, a default read level signal, or the like. The calibrate command 232 may also include a predetermined number of times a walking autocal step should be performed. In accordance with one embodiment of the present technology, the calibration circuitry 110 can calibrate the selected memory regions in response to the calibrate command 232. As part of the calibration, the calibration circuitry 110 performs a first read level calibration. This first read level calibration will determine a first read level offset value. This first read level offset value can be used to determine a second base read level test signal to be used in the second calibration step as shown in FIG. 2. This process may be repeated, using each resulting read level offset value to determine a new base read level test signal for the next calibration step. Each time a calibration step is run, the resulting read level offset value is stored in a persistent memory (e.g., latched in the calibration circuitry 110, in another memory location of memory component 102, in a dedicated embedded memory, or the like), so that the resulting read level offset value can be utilized as and/or to determine the next base read level test signal of the next calibration step. The final read level offset value(s) determined can be returned as the one or more read level offset values 233 to the controller 106 that can represent calculated offsets from the current read level signals of the selected memory regions. In some embodiments, some of the calibration calculation steps, such as determining read level offset values and/or base read level test signals may be performed at the controller 106 and/or the host 108. The controller 106 can then use the read level offset values 233 to update the current read level signals to arrive at an improved read level signal for the selected memory regions. The controller 106 and the host device 108 may then continue to program and/or read the memory component 102 using the calibrated read level signals.

As shown in FIG. 2, read level calibration can occur internal to the memory component 102. This can reduce the time required to perform read level calibration because it eliminates the need for multiple messages between the controller 106 and the memory component 102. For example, the controller 106 can send a single calibration signal 232 to the memory component 102. In response, the calibration circuitry 110 of the memory component 102 internally performs read level calibration using the walking calibration process (as described in greater detail below) and outputs a read level offset value 233 to controller 106. Thus, the controller 106 does not send multiple read signals to the memory component 102 to calibrate one or more selected memory regions during read level calibration. Therefore, the execution time of read level calibration can be reduced, freeing up the memory device 100 to perform other requests and/or tasks.

Figure 3A:
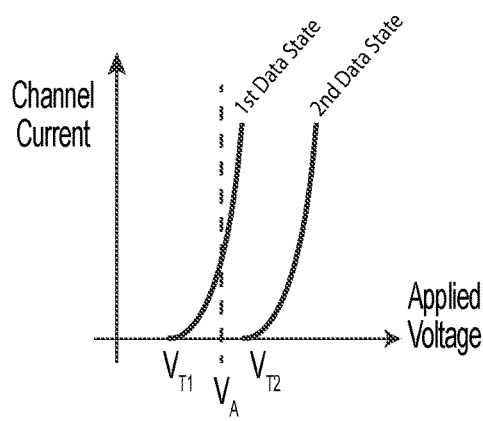
FIGS. 3A and 3B are plots of channel current versus applied voltage of a memory cell within a memory region of a memory device in accordance with an embodiment of the present technology.
Figure 3B:
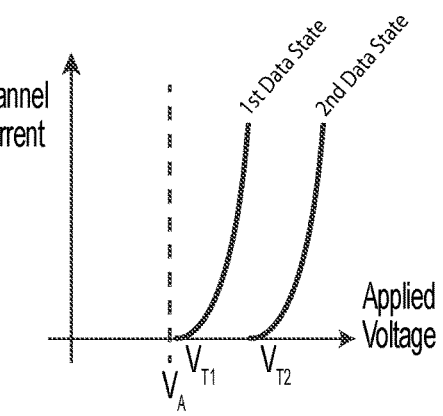

FIGS. 3A and 3B are plots of channel current versus applied voltage of a memory cell, such as one of the memory cells 122 (FIG. 1) within a memory region of the memory component 102 (FIG. 1). Referring to FIG. 3A, the memory cell has a first data state threshold voltage $V_{T1}$ and a second data state threshold voltage $V_{T2}$ representing the voltages required to create a conductive path in the channel of the memory cell programmed with a first data state (e.g., "0") and a second data state (e.g., "1"), respectively. The memory region containing the memory cell has a current read level signal $V_A$ (e.g., a current read level voltage) between the first data state threshold voltage $V_{T1}$ and the second data state threshold voltage $V_{r2}$. As the current read level signal $V_A$ is applied to the memory region, the data state stored on the memory cell may be determined (e.g., read) from the memory cell. For example, if the current read level signal $V_A$ is applied to the memory region and current read from the memory cell in response to the current read level signal $V_A$ is not negligible (e.g., not zero and/or above a threshold value), the data state stored on the memory cell is determined to be in the first data state (e.g., "0"). If, however, the current read from the memory cell is negligible (e.g., zero and/or below a threshold value), the data state stored on the memory cell illustrated in FIG. 3A is determined to be in the second data state (e.g., "1").

In some memory devices, read level signals of a memory region are initially programmed by the manufacturer of a memory device (e.g., at the time of manufacture or initial configuration) and may thereafter remain unchanged for the life of the memory device. However, as the memory region is repeatedly programmed and/or erased, or the memory region is subject to various operations (e.g., writing adjacent memory regions, reading adjacent memory regions, etc.) and/or environmental conditions (e.g., temperatures), the threshold voltages of the memory cells within the memory region can change (e.g., due to the trapping of electrons in the tunnel oxides thereof, leakage of charge from the charge trapping structure, etc.). FIG. 3B illustrates the effect of this phenomenon on the threshold voltages of the memory cell in accordance with one embodiment of the present technology. In the embodiment illustrated in FIG. 3B, the first data state threshold voltage $V_{T1}$ and the second data state voltage $V_{T2}$ have increased in relation to the current read level signal $V_A$ of the memory region containing the memory cell. As shown, applying the current read level signal $V_A$ will result in a negligible current read from the memory cell regardless of whether the memory cell has been programmed with the first data state or the second data state. In other words, a shift in the threshold voltages of the memory cell in relation to the current read level signal of the memory region results in an increased possibility of a bit error from that memory cell. As the occurrence of bit errors begins to gradually increase across multiple memory cells within the memory region, error code correction (ECC) techniques may eventually become ineffective, at which point the controller 106 (FIG. 1) may be unable to properly read out the data stored in the memory region. Thus, calibrating the read level signals of the memory regions within a memory device can significantly increase the performance and/or useful life of the memory device.

Although the memory cell in FIGS. 3A-B is illustrated with two threshold voltages, memory cells may have a different number of threshold voltages (e.g., four, eight, sixteen, etc. threshold voltages) representing more than two data states (e.g., four, eight, sixteen, etc. data states). Similarly, memory regions containing these memory cells may have more than one read level signal (e.g., three, seven, fifteen, etc. read level signals). Memory cells having a larger number of threshold voltages (e.g., MLC memory cells, TLC memory cells, QLC memory cells, etc.) tend to be more prone to bit errors because the tolerances between data states within the memory cells are smaller. Thus, even a small shift in the threshold voltages of these memory cells can begin causing bit errors within fewer write and erase cycles than in memory cells having fewer threshold voltages (e.g., SLC memory cells). Therefore, memory regions containing memory cells having a larger number of threshold voltages can experience a greater benefit from walking read level signal calibrations.

Figure 4A:
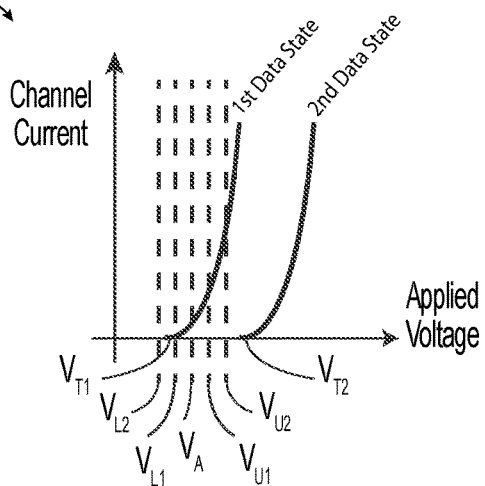
FIGS. 4A-G are various plots, tables, and diagrams illustrating walking read level calibration of a memory region in accordance with embodiments of the present technology.
Figure 4B:
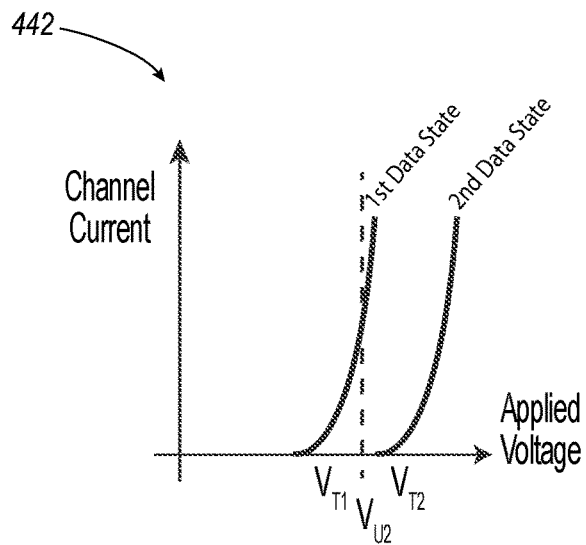
Figure 4C:
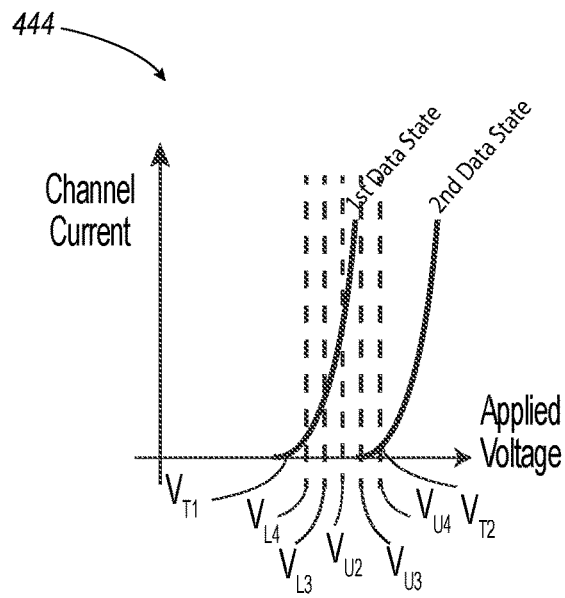

FIGS. 4A-G are various plots, tables, and diagrams illustrating read level calibration of a memory region in accordance with embodiments of the present technology. After the calibration circuitry 110 (FIG. 1) receives a calibration command 232 (FIG. 2) from the controller 106 (FIG. 1) that includes, for example, the physical address(es) of the memory region, the calibration circuitry 110 (FIG. 1) of the memory component 102 can apply various test signals (e.g., test voltages) to the memory region to calibrate one or more of the current read level signals (e.g., the current read level voltages) of the memory region. Each iterative calibration step as described herein yields a read level offset value that can be combined with a current read level voltage value to yield an improved read level signal. After a desired number of iterations of the walking autocal process is complete, the improved read level signal can be used as a new current read level voltage or a plurality of new improved read level signals can be used to calculate one or more new current read level voltages as described herein. The current read level signals can be the default read level signals (e.g., the default read level voltages) initially programmed by the manufacturer and/or the current read level signals can be previously calibrated read level signals. In FIG. 4A, a first read level calibration iteration using a current read level signal $V_A$ is shown. FIG. 4B shows one of the test signals $V_{U2}$ that was calculated to be an improved read level signal in the first read level calibration of FIG. 4A. The new improved read level signal with a voltage equal to the test signal $V_{U2}$ is then used as a base read level test signal for a second read level calibration iteration as shown in FIG. 4C. FIGS. 4D-G show additional details and examples of how a read level offset value may be determined in any single calibration step of a walking, iterative autocal process and subsequently used to determine improved read level signals, of which a last improved read level signal can be set as and/or used to determine new current read level signal(s).

As shown in plot 440 of FIG. 4A, the calibration circuitry 110 applies five test signals to the memory region containing the depicted memory cell. More specifically, the calibration circuitry 110 applies the current read level signal $V_A$ (i.e., a first base read level test signal $V_A$), two upper test signals $V_{U1}$, $V_{U2}$ offset (e.g., at 20 mV intervals) above the base read level test signal $V_A$, and two lower test signals $V_LA$, $V_{L2}$ offset (e.g., at 20 mV intervals) below the base read level test signal $V_A$. In various embodiments, the calibration circuitry 110 can apply a different number of test signals (e.g., three, seven, nine, etc. test signals) to the memory region and/or can apply a different arrangement of test signals (e.g., three upper test signals and one lower test signal or vice versa) to the memory region. In various embodiments, the test signals may be uniformly spaced apart and/or the spacing between the test signals may vary.

The calibration of FIG. 4A yields a first read level offset value, in accordance with, e.g., a method of selecting an offset value illustrated in greater detail below, with respect to FIGS. 4D-4G. The first read level offset value is utilized to determine an improved read level test signal that serves as a base read level test signal for a next calibration step. Referring to plot 442 of FIG. 4B, the first read level offset value in this example is equal to the difference of a voltage value of test signal $V_{U2}$ and a base read level test signal (which in this example has the same voltage of the current read level signal $V_A$). Although in this example the voltage of $V_{U2}$ is used, the first read level offset value may be a difference between any one of the read level test signals shown in FIG. 4A and the current read level signal $V_A$.

In some embodiments, the determined improved read level signal voltage is in between any two of the test signals $V_A$, $V_{U1}$, $V_{U2}$, $V_{LA}$, and/or $V_{L2}$. In one of these cases, when the first read level offset value and the current read level signal voltage is combined, the resulting base read level test signal has a voltage not equal to any of the test signals. Additionally, in some embodiments, the first base read level test signal may not have a voltage equal to the current read level signal. Accordingly, the first read level offset value is determined during the first calibration, and that first read level offset value is combined with the first base read level test signal voltage to yield an improved read level signal voltage that is also used as a second base read level test signal for a second calibration process iteration.

FIG. 4B shows the test signal $V_{U2}$, which in this example has the same voltage of the determined second base read level test signal. Accordingly, for simplicity, the test signal $V_{U2}$ is shown in FIG. 4C as the base read level test signal for the second calibration iteration along with the test signals $V_{U3}$, $V_{U4}$, $V_{L3}$, and $V_{L4}$ of the second calibration iteration. In this example, the second base read level test signal has a voltage equal to the current read level signal $V_A$ voltage plus the first read level offset value.

Accordingly, plot 444 of FIG. 4C shows the second base read level test signal as the test signal $V_{U2}$. In other words, if N represents an iteration number of the calibration steps according to the walking autocal process described herein, a base read level test signal of any calibration step N+ is determined by adding a determined read level offset value determined during a calibration step N to the base read level test signal voltage value of a prior calibration step (where N is greater than 1). In FIG. 4C, a second calibration step is performed using the second base read level test signal with a voltage level equal to $V_{U2}$. In this second calibration step, the calibration circuitry 110 applies the five test signals to the memory region.

In some embodiments, any test signals with a voltage equal to a test signal applied in a previous calibration step may not be applied. For example, $V_{L3}$ and $V_{L4}$ may be varied or set so that they do not have the same voltage levels as the current read level signal $V_A$ (the first base read level test signal) and test signal $V_{U1}$ that were utilized as test signals in the first calibration process. This may be accomplished in various embodiments by varying the offset between one or more of the test signals of the second calibration process. In another example, since the second base read level test signal (with a voltage equal to the test signal $V_{U2}$) is above the first base read level test signal (with a voltage equal to $V_A$), the calibration circuitry 110 may apply additional test signals that are above the second base read level test signal voltage, or may only apply test signals that are above the second base read level test signal voltage. In a similar example, if the second base read level test signal is lower than the first base read level test signal, the calibration circuitry 110 may apply more test signals below (or may only apply test signals below) the second base read level test signal. In the example shown in FIG. 4C, the second base read level test signal has a voltage equal to the test signal $V_{U2}$. Since that test signal $V_{U2}$ had already been tested in the first calibration step, the calibration circuitry may omit running a test at that voltage, and instead may use the sensed data from the first calibration step with respect to $V_{U2}$ during the second calibration step (or any other calibration step). Similarly, the data sensed in the first calibration step with respect to the first base level test signal and $V_{U1}$ may also be utilized during the second calibration step (or any other calibration step). If any of the test signals shown in FIG. 4C (e.g., $V_{U2}$, $V_{L3}$, and/or $V_{L4}$) are omitted from the second calibration step, other test signals at different voltages may be applied.

Referring back to the example in FIG. 4C, the calibration circuitry 110 applies test signals including the second base read level test signal shown as $V_{U2}$ (i.e., the output of the first calibration step), two upper test signals $V_{U3}$, $V_{U4}$ offset (e.g., at 20 mV intervals) above the second base read level test signal shown as $V_{U2}$, and two lower test signals $V_{L3}$, $V_{L4}$, offset (e.g., at 20 mV intervals) below the second base read level test signal shown as $V_{U2}$. In various embodiments, the calibration circuitry 110 can apply a different number of test signals (e.g., three, seven, nine, etc. test signals) to the memory region and/or can apply a different arrangement of test signals (e.g., three upper test signals and one lower test signal or vice versa) to the memory region. In various embodiments, the test signals may be uniformly spaced apart and/or the spacing between the test signals may vary.

In various embodiments, additional calibration steps may be performed. For example, the output of the calibration step shown in FIG. 4C may be a second read level offset value. That second read level offset value can be used to determine a third base read level test signal. The third base read level test signal may be determined by combining the second read level offset value with the second base read level test signal voltage value. The third base read level test signal (along with any other test signals) can then be used to perform a third calibration step. In this way, the effective range and accuracy of calibration of a memory device can be expanded. Any number of additional calibration steps N may be performed in this manner. The multiple calibration steps may be used for fine tuning as well. For example, a first calibration step (e.g., as shown in FIG. 4A) may use relatively larger offsets between the base read level test signal (shown as, e.g., $V_A$) and the other read level test signals (e.g., $V_{L1}$, $V_{L2}$, $V_{U1}$, $V_{U2}$). In a second calibration step (e.g., as shown in FIG. 4C), relatively smaller offsets between the base read level test signal (shown as, e.g., $V_{U2}$) and the other read level test signals (e.g., $V_{L3}$, $V_{U4}$, $V_{U3}$, $V_{U4}$) may be used. In this way, fine tuning to focus in on an accurate read level offset values and improved read level voltages may be performed. In various embodiments, different calibration steps may also have different total numbers of read level test signals. In various embodiments, different calibration steps may also have different numbers of read level test signals above and/or below each steps' respective base read level test signal.

In other embodiments, the system may react dynamically to the determined read level offset values. For example, if a first calibration step does not yield measurements that indicate an improvement in the performance of the memory region with any of the utilized test signals, the system may, in subsequent calibration steps, utilize larger or smaller offsets between read level test signals, expand or reduce the total number of test signals, adjust the number of test signals above and/or below the base read level test signals, and/or adjust the value of a base read level test signal.

FIGS. 4D-G show embodiments for determining a read level offset value as described below based on the application of a plurality of read level test signals as described herein. Any one of the embodiments shown and discussed below with respect to FIG. 4D-G may be utilized in any one calibration step of a walking autocal process. In other words, FIGS. 4D-G show the calculations that may take place for determining a single read level offset value that may be used to determine a base read level test signal to perform a subsequent calibration step, which also may use the calculations discussed with respect to FIGS. 4D-G. In the particular example of FIGS. 4D-G, an example for determining a first read level offset value for a calibration step referring to FIG. 4A is demonstrated.

Figures 4D, 4E:
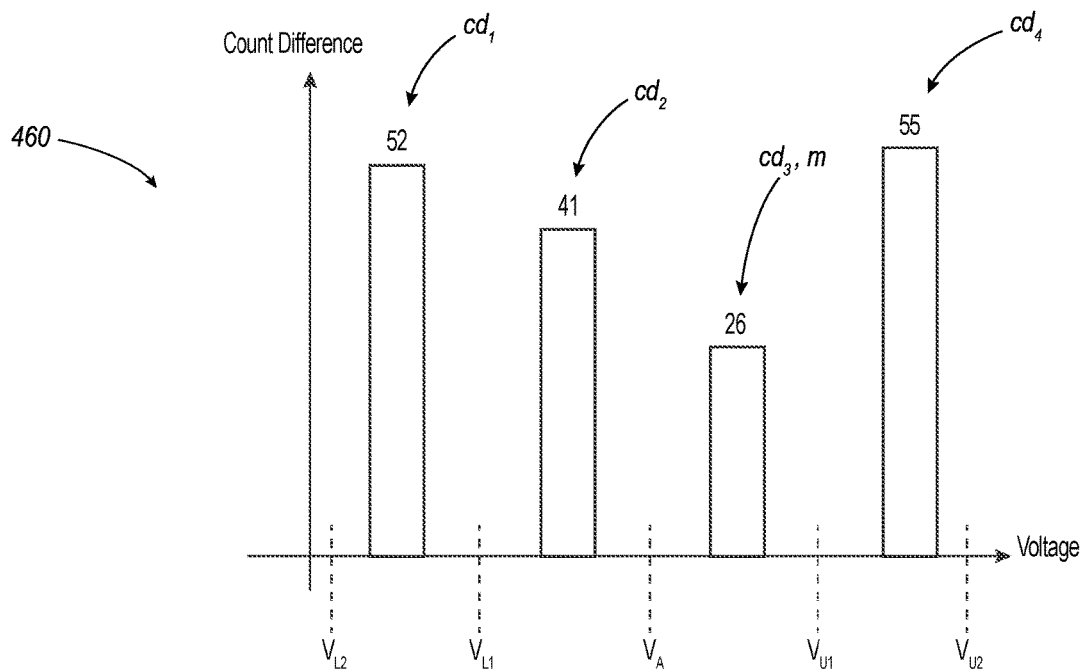

Referring to FIGS. 4D and 4E, the calibration circuitry 110 applies each of the test signals to the memory region (e.g., the test signals shown in FIG. 4A), and the calibration circuitry 110 can determine a number of memory cells within the memory region (e.g., a count) that output a specified data state (e.g., a current above a threshold value and/or a current below a threshold value). In the embodiment illustrated in FIG. 4D, the calibration circuitry 110 determines a count as each of the test signals $V_{L2}$, $V_{L1}$, $V_A$, $V_{U1}$, $V_{U2}$ are applied to the memory region. As shown in table 450 of FIG. 4D, when the calibration circuitry 110 applies the lower test signal $V_{L2}$ to the memory region, 586 memory cells output the specified data state. Similarly, when the calibration circuitry 110 applies the lower test signal $V_{L1}$, 534 memory cells output the specified data state; when the calibration circuitry 110 applies the first base read level test signal $V_A$, 493 memory cells output the specified data state; when the calibration circuitry 110 applies the upper test signal $V_{U1}$, 467 memory cells output the specified data state; and when the calibration circuitry 110 applies the upper test signal $V_{U2}$ to the memory region, 411 memory cells output the specified data state.

After the calibration circuitry 110 obtains counts indicative of the number of memory cells that output the specified data state as each read level test signal is applied to the memory region, the calibration circuitry 110 can calculate count differences between the counts corresponding to adjacent test signals. For example and as shown in table 450 of FIG. 4D, the calibration circuitry 110 calculates four count differences $cd_1$-$cd_4$ as follows: (1) the count difference between the lower test signal $V_{L2}$ and the lower test signal $V_{L1}$; (2) the count difference between the lower test signal $V_{L1}$ and the first base read level test signal $V_A$; (3) the count difference between the first base read level test signal $V_A$ and the upper test signal $V_{U1}$; and (4) the count difference between the upper test signal $V_{U1}$ and the upper test signal $V_{U2}$. The calibration circuitry 110 can then compare the count differences to determine a minimum count difference. As shown in table 450 of FIG. 4D and histogram 460 of FIG. 4E, the count difference $cd_3$ (i.e., the difference in counts obtained with the first base read level test signal $V_A$ and the upper test signal $V_{U1}$) is determined to be minimum count difference m.

Figures 4F, 4G:
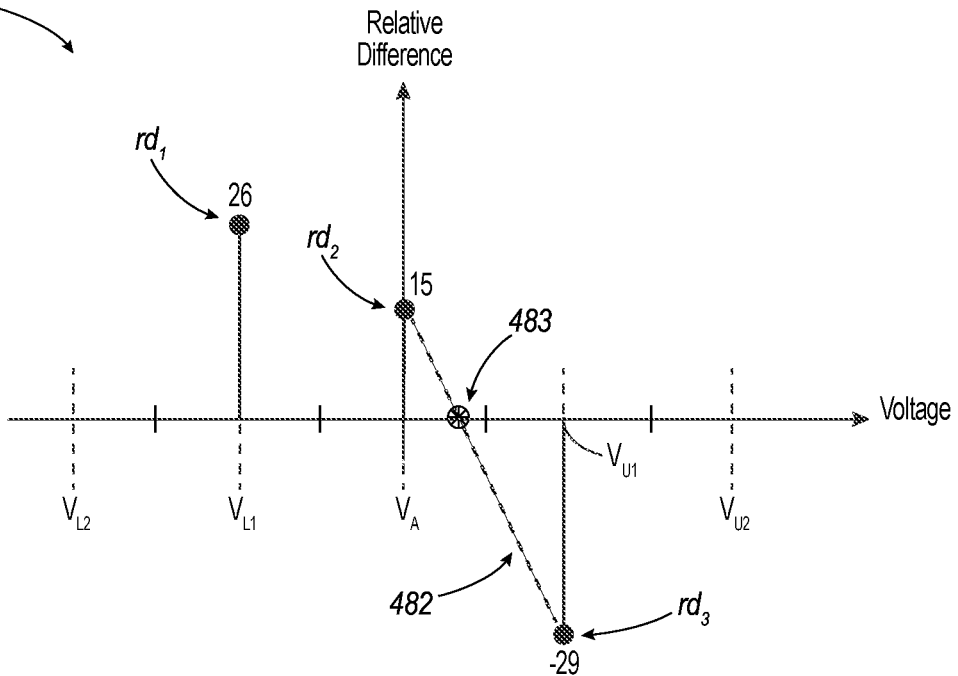

The bit counts and count differences shown in FIGS. 4D and 4E are collectively referred to herein as performance characteristics. The relative differences and extrapolations between relative differences discussed below with respect to FIGS. 4F and 4G are also performance characteristics of the output of a memory region based on the application of test signals. One, some, or all of these performance characteristics can be utilized to determine one or more read level offset values that are output by the calibration circuitry 110 to a controller and/or host. As described herein, a read level offset value can be utilized to adjust a current read level signal for reading the data states of memory cells and/or for adjusting a base read level test signal for a subsequent calibration step.

In some embodiments, the calibration circuitry 110 may determine a read level offset value based on the minimum count difference m shown in FIGS. 4D and 4E. For example, the calibration circuitry 110 may determine the read level offset value to be the read level test value nearest the minimum count difference m that is also closest to the first base read level test signal $V_A$, which in this instance would be the first base read level test signal $V_A$ voltage level. In another example, the read level offset value may be determined to be the read level test value nearest the minimum count difference m that is farther from the first base read level test signal $V_A$, which in this instance would be the upper test signal $V_{U1}$ voltage level. In another example, the calibration circuitry may determine the read level offset value to be somewhere between the two test values between which the minimum count difference m was found. For example, the read level offset value may be determined to be a voltage level halfway between the first base read level test signal $V_A$ and the upper test signal $V_{U1}$. In various embodiments, other methods for determining the read level offset value may be utilized. For example, a test signal having the highest bit count as shown in FIG. 4D may be determined to be the read level offset value. Another embodiment for determining a read level offset value is described below with respect to FIGS. 4F and 4G.

Referring now to FIG. 4F, once the calibration circuitry 110 obtains the minimum count difference m, the calibration circuitry 110 can calculate differences between the other count differences and the minimum count difference (i.e., differences relative to the minimum count difference). For example and as shown in table 470 of FIG. 4F, the calibration circuitry 110 can calculate relative differences $rd_1$-$rd_3$ between each of the count differences $cd_1$, $cd_2$, $cd_4$ and the minimum count difference m (i.e., the count difference $cd_3$). As shown in the illustrated embodiment, the relative difference $rd_1$ between the count difference $cd_1$ and the minimum count difference m is 26. Similarly, the relative difference $rd_2$ between the count difference $cd_2$ and the minimum count difference m is 15, and the relative difference $rd_3$ between the minimum count difference m and the count difference $cd_4$ is −29. The relative difference $rd_3$ is represented as a negative value in the illustrated embodiment because this relative difference corresponds to test signals, counts, and a count difference that are offset above and to the right of the minimum count difference m.

After the calibration circuitry 110 calculates the relative differences between the other count differences and the minimum count difference, the calibration circuitry 110 can extrapolate a value between adjacent relative differences having opposite signs (i.e., between relative differences corresponding to count differences adjacent to and surrounding the minimum count difference). FIG. 4G is a plot 480 graphically representing the extrapolation calculation. As shown, a sign change occurs between the graphical representation of the relative difference $rd_2$ and the graphical representation of the relative difference $rd_3$. Thus, the relative differences $rd_2$ and the relative difference $rd_3$ are the relative differences corresponding to the count differences adjacent to and surrounding the minimum count difference m. In contrast, no sign change occurs between the graphical representation of the relative difference $rd_1$ and the graphical representation of the relative difference $rd_2$. Therefore, the calibration circuitry 110 extrapolates a value 483 between the relative difference $rd_2$ and the relative difference $rd_3$ in the illustrated embodiment. In the plot 480 of FIG. 4G, an extrapolation curve 482 is shown intersecting the peaks of the graphical representation of the relative difference $rd_2$ and the graphical representation of the relative difference $rd_3$. In this embodiment, the extrapolated value 483 corresponds to the point at which the extrapolation curve 482 crosses the x-axis of plot 480. The calibration circuitry 110 may, for example, determine a read level offset value that corresponds to the extrapolated value 483 (i.e., a voltage value dependent on the relative difference $rd_2$ corresponding to the first base read level test signal $V_A$ voltage value and the relative difference $rd_3$ corresponding to the upper test signal $V_{U1}$ voltage level. In another embodiment, the calibration circuitry 110 may determine a read level offset value corresponding to a distance between the base read level signal (e.g., the first base read level test voltage $V_A$) and the extrapolated value 483. In another embodiment, the calibration circuitry 110 may determine a read level offset value corresponding to a distance between the upper test signal $V_{U1}$ voltage level and the extrapolated value 483. In another embodiment, the calibration circuitry 110 may determine a read level offset value to be a test signal voltage that the extrapolated value 483 is closest to (e.g., the first base read level test signal $V_A$ in the example shown in FIG. 4G). Other methods of determining the read level offset value utilizing read level test signals may also be used in various embodiments.

In some embodiments, the read level offset value can be rounded to a nearest offset step value (e.g., the nearest 5 mV or 10 mV offset step value) to facilitate easier storage as an integer value (e.g. a byte and/or a signed integer value). For example, in the embodiment illustrated in FIG. 4G, where the first base read level test signal $V_A$ and the upper test signal $V_{U1}$ are separated by 20 mV, the read level offset value can represent an offset of about 7 mV above the base offset read level test signal $V_B$. If the memory device is configured to round read level offset values to the nearest ±10 mV offset step value, then the read level offset value of +7 mV would be rounded to a value of +10 mV (e.g., the calibration circuitry 110 would return a value of +10 mV indicating that the first read level offset value should be about 10 mV above the first base read level test signal $V_A$). Similarly, if the first read level offset value was calculated for another memory region to be 4 mV above the first base read level test signal $V_A$, and the memory device was configured to round a read level offset value to the nearest ±10 mV offset step value, then the first read level offset value of +4 mV would be rounded to a value of 0 mV. In these embodiments, as discussed above, a read level offset can be used to determine a base read level test signal for a subsequent calibration step in the walking autocal process. If the instant calibration step is the last calibration step in the walking autocal process, the resulting read level offset can be combined with the read level offsets calculated in the other calibration steps to yield a total read level offset value and be output to the controller 106 and/or the host 108 to adjust the current read level signal. Alternatively, the resulting read level offset can be used to determine a new current read level signal that is output to the controller 106 and/or the host 108 to be set as the current read level signal.

In other words, a total read level offset value may be output by the calibration circuitry 110 to a controller 106 and/or host 108 as described herein. In such embodiments, the controller 106 and/or the host 108 may add the total read level offset value to the amount the current read level test signal is set at. In this way, the controller 106 and/or the host 108 can set a new, calibrated current read level signal. This can occur after multiple calibration steps performed as part of the iterative walking autocal process.

In some embodiments, the memory region can be a memory page within a larger memory region (e.g., a memory block, a memory unit, etc.) and/or a memory block within a larger memory region (e.g., a memory unit). In these and other embodiments, walking read level calibration can be performed on more than one memory page and/or on more than one memory block within a larger memory region. As such, the calibration circuitry 110 can produce multiple total read level offset values by performing read level calibration on the larger memory region (e.g., on all or a subset of the memory pages and/or on all or a subset of the memory blocks comprising the larger memory region). In such an embodiment, the calibration circuitry 110 can calculate an average total read level offset value for the larger memory region from the multiple instances of the walking autocal process being used in the manner described in greater detail with reference to FIGS. 5A-B, below.

Figure 5A:
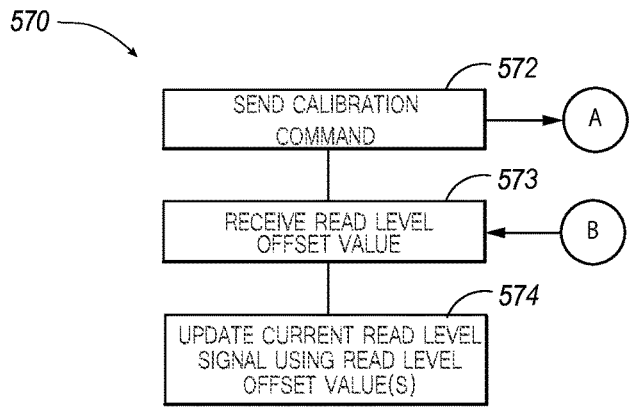
FIGS. 5A and 5B are flow diagrams illustrating methods for operating a memory device in accordance with an embodiment of the present technology.
Figure 5B:
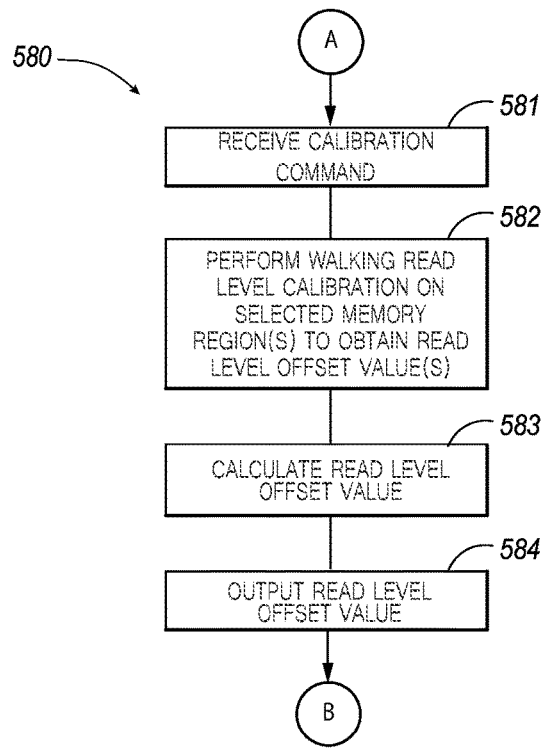

FIGS. 5A and 5B are flow diagrams illustrating routine 570 and routine 580, respectively, for operating a memory device in accordance with an embodiment of the present technology. Routine 570 can be executed, for example, by the controller 106 (FIG. 1) of the memory device 100 (FIG. 1), and routine 580 can be executed, for example, by the calibration circuitry 110 (FIG. 1) of the memory component 102 (FIG. 1) of the memory device 100. In one embodiment, the routine 570 and the routine 580 can be carried out automatically after the controller 106 has programmed (e.g., written to and/or erased) one or more memory regions of the memory component 102 a predefined number of times (e.g., 1, 25, 100, 400, 800, 1000, 10000, etc. times). In other embodiments, the routine 570 and the routine 580 can be carried out in response to a calibration command that originates from the host device 108 (FIG. 1). In still other embodiments, the routine 570 and the routine 580 can be carried out upon the occurrence of other events, e.g., after a specified amount of time has elapsed, after the memory device 100 is first powered on or connected to a host device, when a memory device 100 is subjected to a particular temperature threshold, when a memory device is subjected to a particular threshold for a predetermined period of time, and/or upon completion of other commands (e.g., read commands).

Referring to FIG. 5A, the routine 570 begins by sending a calibration command (block 572), such as the calibration command 232 of FIG. 2. The calibration command may include details on how many calibration steps to perform, and/or the parameters for performing them. In other embodiments, some or all of those factors may be pre-installed in the calibration circuitry and/or may be determined by the calibration circuitry 110, the controller 106, and/or the host 108 automatically depending on results of the various steps of the walking autocal process. These aspects may also be determined by other factors, such as based on the occurrence of other events, e.g., after a specified amount of time has elapsed, after the memory device 100 is first powered on or connected to a host device, when a memory device 100 is subjected to a particular temperature threshold, when a memory device is subjected to a particular threshold for a predetermined period of time, and/or upon completion of other commands (e.g., read commands). In various embodiments, other methods of determining the parameters of the calibration steps and the number of calibration steps to perform may be utilized.

The calibration command in block 572 is sent to the routine 580 and contains, e.g., one or more logical addresses of selected memory regions (e.g., of one or more selected memory pages, blocks, logic units, etc.) of the memory component 102 and/or one or more current read level signals (e.g., current read level voltages) of the selected memory regions. As discussed above, the current read level signals may be default read level signals (e.g., default read level voltages) initially programmed by the manufacturer and/or the current read level signals may be read level signals (e.g., read level voltages) previously calibrated in accordance with the present technology. In some embodiments, the one or more memory regions are indicated by the calibration command 572 (e.g., the regions can be selected by the controller 106 or the host device 108). In other embodiments, the calibration circuitry 110 can select the one or more memory regions in response to the calibration command 572 and/or retrieve (e.g., from a table stored within the memory component 102 and/or the embedded memory 132 of controller 106) the corresponding current read level signal(s) for the selected memory region(s).

Referring now to FIG. 5B, the routine 580 receives the calibration command (block 581). The routine 580 proceeds to perform the walking read level calibrations on the selected memory regions to produce one or more total read level offset values (block 582) in accordance with the discussion of FIGS. 2 and 4A-G above. In some embodiments as described above, the output of the walking read level calibrations may be a new current read level signal rather than a total read level offset value. However, the new current read level signal may undergo similar processing as described herein, as the new current read level signal is a combination of the read level offset values calculated during each step of a walking read level calibration process and a previous current read level signal.

Referring back to FIG. 5B, the selected memory regions can be one or more memory units, and the routine 580 can perform walking read level calibrations on a predefined number of memory blocks (e.g., a sampled subset of memory blocks) of each memory unit by, for example, performing read level calibration on a predefined number of memory pages per word line group (e.g., two edge memory pages and a middle memory page per word line group) of each memory block. In other embodiments, the selected memory regions can be one or more memory blocks, and the routine 580 can perform walking read level calibrations on a predefined number of memory pages per word line group (e.g., a sampled subset of memory pages per word line group) within the selected memory blocks.

After the routine 580 obtains the one or more total read level offset values produced by performing walking read level calibrations on the selected memory region(s) (block 582), the routine 580 can calculate an average total read level offset value (e.g., per memory page, per word line group, per memory block, per memory unit, etc.) (block 583) from the obtained total read level offset value(s). For example, the routine 580 can calculate an average total read level offset value by taking the median of the obtained total read level offset values (e.g., a median byte and/or a median signed integer value). In other embodiments, the routine 580 can calculate the average total read level offset value using other averaging techniques (e.g., mean, mode, etc.). In these and other embodiments, the routine 580 can omit outlier total read level offset values (e.g., values greater than ±10 digital to analog (DAC) offsets) obtained from performing walking read level calibration on the selected memory region(s) (block 582) before calculating the average total read level offset value (block 583). In some embodiments, the routine 580 can calculate the average total read level offset value before rounding to the nearest offset step value. In other embodiments, the routine 580 can calculate the average total read level offset value after rounding the obtained total read level offset values to the nearest offset step value. Furthermore, in embodiments that produce a single total read level offset value after performing walking read level calibrations on the selected memory region(s), the single total read level offset value can be treated as an average total read level offset value for the selected memory region(s). The routine 580 can then output the average total read level offset value to the routine 570 (block 584).

Referring again to FIG. 5A, the routine 570 can receive the average total read level offset value from the routine 580 (block 573). The routine 570 can then use the average total read level offset value to update the current read level signal for the selected memory region (block 574). The routine 570 can use the average total read level offset value (e.g., when the average total read level offset value is represented as a byte and/or as a signed integer value) to update a stored calibration value for the current read level signal of the selected memory region (block 584). In these embodiments, the current read level signal for the selected memory region can be represented as, for example, the default read level signal plus a calibration value plus any other system offsets. The calibration value can initially be set equal to zero when the memory device 100 is initially configured (e.g., at the time of manufacture, or upon initialization), and the routine 570 can update the calibration value by, e.g., adding the average total read level offset value received from the routine 580 to the previous calibration value to obtain a new calibration value. For example, in one embodiment, if the previous calibration value was +5 mV (e.g., representing a 5 mV offset above an original read level signal), and the average total read level offset value determined by a read level calibration operation is +10 mV (e.g., representing a 10 mV offset above a center test signal of the read level calibration), then the routine 580 can update the stored calibration value by summing the stored calibration value with the average total read level offset value to obtain an updated calibration value (e.g., +5 mV summed with +10 mV returns +15 mV).

Accordingly, in subsequent iterations of read level calibration of the selected memory region (either walking calibrations or non-walking calibrations), the calibration value can be updated by adding the newly-obtained average total read level offset value(s) from the routine 580 to the stored calibration value. Thus, the updated calibration value(s) can represent instructions to increase or decrease the current read level signal for the memory region (e.g., by ±5 mV, ±10 mV, ±20 mV, and/or other voltage values) relative to a previous read level signal for the selected memory region in order to arrive at an improved read level signal for the memory region. In these and other embodiments, the routine 570 can store the updated calibration value and/or the updated current read level signal in, for example, a table stored on the memory component 102 and/or embedded memory 132 of the controller 106 of the memory device 100, so that routine 570 can continue to track these values (e.g., as persistent data to be loaded upon each power up of the memory device 100). In embodiments where a new current read level signal is determined/output by the calibration circuitry 110, the new current read level signal is set as the current read level signal.

While in the foregoing exemplary embodiments, walking read level calibration operations have been described as outputting values representing offsets by which read level signals can be adjusted, the present technology is not limited to this arrangement. In other embodiments, the routine 570 can translate the average total read level offset value into, e.g., a scalar value that can represent a scale factor to apply to the current read level signal for the memory region in order to arrive at an improved read level signal. In still other embodiments, a walking read level calibration operation can translate a calculated average total read level offset value into other instructions to update or otherwise modify the current read level signal (e.g., as a read level signal value, instead of an offset to a stored value, etc.).

In accordance with another aspect of the present disclosure, the foregoing walking read level calibration operations can be performed during an error recovery operation, providing an increased likelihood of success in recovering from, e.g., a read error caused by the undesired shift of a threshold voltage. In this regard, error recovery operations can involve a variety of remedial operations, which may be performed in a predetermined sequence (e.g., in an order sorted by increasing energy consumption, delay, or other cost function). One such sequence can involve multiple read retry operations with adjusted threshold voltages (e.g., alternating between increased and decreased threshold voltages). Read retry operations are generally low cost (e.g., in terms of energy and delay) to implement, but may not be successful for errors caused by larger threshold voltage shifts. Accordingly, if read retry operations do not resolve the error, one or more walking read level calibration operations such as those set forth above can be tried (e.g., to locate the greatly-offset threshold voltage level with an iterative calibration process with greater capability of locating the threshold voltage level than the read retry operations). Including one or more such walking read level calibration operations in an error recovery flow can provide not only an increased likelihood of resolving an error, but can further provide information corresponding to an updated threshold voltage level, as set forth in greater detail above (e.g., reducing the likelihood of future errors at the same location due to the large threshold voltage shift).

Figure 6:
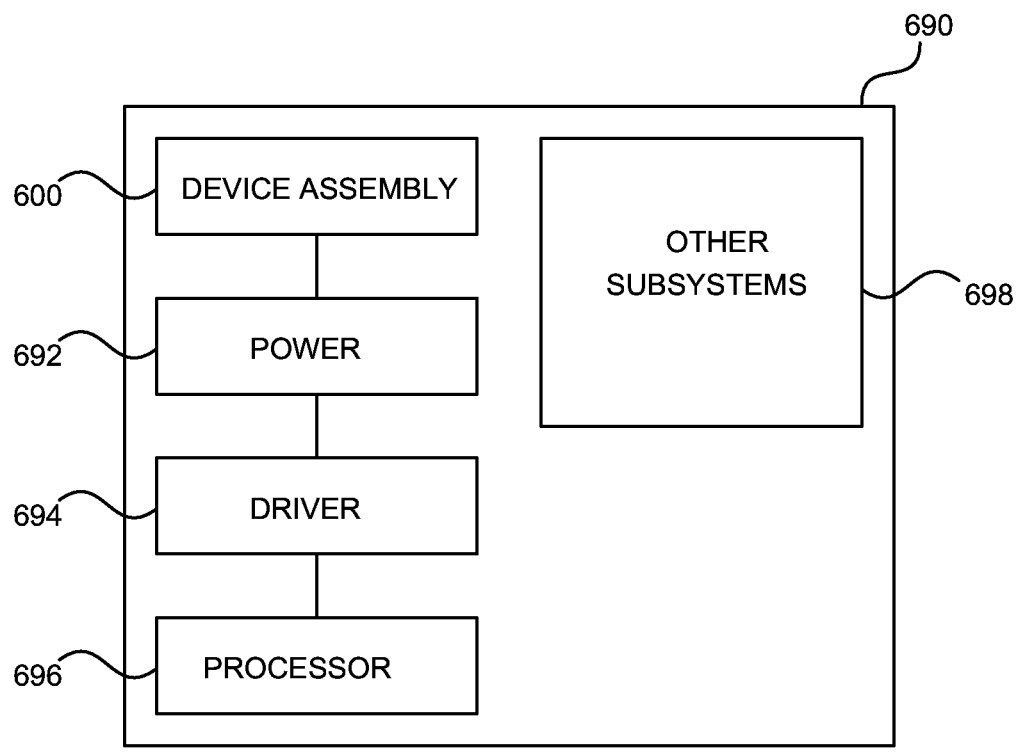
FIG. 6 is a schematic view of a system that includes a memory device in accordance with embodiments of the present technology.

FIG. 6 is a schematic view of a system that includes a memory device in accordance with embodiments of the present technology. Any one of the foregoing memory devices described above with reference to FIGS. 1-5B can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems and components 698. The semiconductor device assembly 600 can include features generally similar to those of the memory device described above with reference to FIGS. 1-5B, and can, therefore, include various features that calibrate read level signals. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

From the foregoing, it will be appreciated that specific embodiments of the invention have been described herein for purposes of illustration, but that various modifications may be made without deviating from the disclosure. For example, in one embodiment, the calibration circuitry 110 (FIG. 1) can select one or more memory regions to be calibrated absent a calibration command (e.g., a calibration command 232 from the controller 106 and/or from the host device 108; FIGS. 1-2). The calibration circuitry 110 can select the memory regions to be calibrated, for example, based on factors such as the number of times a memory region has been read, erased, and/or written to; the amount of time that has elapsed since the memory region was last calibrated; random sampling (e.g., of one or more memory pages within a memory block, of one or more memory blocks within a memory unit, etc.); and/or in accordance with a predefined order of memory regions. In these and other embodiments, a single component (e.g., the calibration circuitry 110) of system 101 (FIG. 1) can perform each of the steps of the routine 570 and the routine 580 discussed above with respect to FIGS. 5A-B (e.g., absent a calibration command). In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A system comprising:
   a memory component comprising a memory region having a plurality of memory cells configured to read out data states in response to application of a current read level signal, and
   calibration circuitry operably coupled to the memory region and configured to:
      measure, for a portion of the memory region, first performance characteristics for each of a first plurality of read level test signals comprising a first base read level test signal;
      determine a first read level offset value corresponding to one or more of the first plurality of read level test signals based on the measured first performance characteristics;
      determine, based on the first read level offset value, a second base read level test signal;
      measure, for the portion of the memory region, second performance characteristics for each of a second plurality of read level test signals comprising the second base read level test signal; and
      determine a second read level offset value corresponding to one or more of the second plurality of read level test signals based on the measured second performance characteristics.

2. The system of claim 1, further comprising:
   a controller coupled to the calibration circuitry, wherein the calibration circuitry is further configured to provide the second read level offset value to the controller.

3. The system of claim 2, wherein the second read level offset value is provided by the calibration circuitry in response to a calibration command received from the controller.

4. The system of claim 1, wherein first base read level test signal and the second base read level test signal are different.

5. The system of claim 1, wherein the calibration circuitry is further configured to:
   determine, based on the second read level offset value, a third base read level test signal;
   measure, for the portion of the memory region, third performance characteristics for each of a third plurality of read level test signals comprising the third base read level test signal; and
   determine a third read level offset value corresponding to one or more of the third plurality of read level test signals based on the measured third performance characteristics.

6. The system of claim 1, wherein the first base read level test signal, the second base read level test signal, and the third base read level test signal are each different from one another.

7. The system of claim 1, wherein the memory region comprises a memory block including a plurality of word line groups, and wherein the portion comprises a subset of the plurality of word line groups.

8. The system of claim 1, wherein the memory region comprises a memory block including a plurality of word line groups, each word line group having a plurality of memory pages, and wherein the portion comprises two endmost memory pages and an inner memory page from each word line group.

9. The system of claim 1, wherein:
   the first plurality of read level test signals include the first base read level test signal of the memory region, at least two signals offset above the first base read level test signal, and at least two signals offset below the first base read level test signal;
   measuring the first performance characteristics includes:
      applying each of the first plurality of read level test signals to a subset of memory cells within the memory region, and
      detecting counts of memory cells in the subset of memory cells that output a preselected data state in response to each of the first plurality of read level test signals; and
   determining the first read level offset value includes:
      measuring count differences between adjacent counts of memory cells,
      calculating relative differences at least between the count differences adjacent to the smallest count difference and the smallest count difference,
      extrapolating an extrapolated level between the relative differences, and
      determining the first read level offset value as a distance between the extrapolated level and the current read level signal of the memory region.

10. A method comprising:
    measuring, for a portion of a memory region, first performance characteristics for each of a first plurality of read level test signals comprising a first base read level test signal;
    determining a first read level offset value corresponding to one or more of the first plurality of read level test signals based on the measured first performance characteristics;
    determining, based on the first read level offset value, a second base read level test signal;
    measuring, for the portion of the memory region, second performance characteristics for each of a second plurality of read level test signals comprising the second base read level test signal; and
    determining a second read level offset value corresponding to one or more of the second plurality of read level test signals based on the measured second performance characteristics.

11. The method of claim 10, further comprising providing the second read level offset value to a controller.

12. The method of claim 11, further comprising providing the second read level offset value in response to a calibration command received from the controller.

13. The method of claim 10, wherein first base read level test signal and the second base read level test signal are different.

14. The method of claim 10, further comprising updating the current read level signal based on the second read level offset value.

15. The method of claim 10, further comprising:
    determining, based on the second read level offset value, a third base read level test signal;
    measuring, for the portion of the memory region, third performance characteristics for each of a third plurality of read level test signals comprising the third base read level test signal; and
    determining a third read level offset value corresponding to one or more of the third plurality of read level test signals based on the measured third performance characteristics.

16. The method of claim 15, wherein the first base read level test signal, the second base read level test signal, and the third base read level test signal are each different from one another.

17. The method of claim 15, further comprising updating the current read level signal based on the third read level offset value.

18. The method of claim 10, wherein:
the first plurality of read level test signals include the first base read level test signal of the memory region, at least two signals offset above the first base read level test signal, and at least two signals offset below the first base read level test signal;
measuring the first performance characteristics includes:
applying each of the first plurality of read level test signals to a subset of memory cells within the memory region, and
detecting counts of memory cells in the subset of memory cells that output a preselected data state in response to each of the first plurality of read level test signals; and
determining the first read level offset value includes:
measuring count differences between adjacent counts of memory cells,
calculating relative differences at least between the count differences adjacent to the smallest count difference and the smallest count difference,
extrapolating an extrapolated level between the relative differences, and
determining the first read level offset value as a distance between the extrapolated level and the current read level signal of the memory region.

19. The method of claim 10, wherein determining the first read level offset includes:
measuring count differences between adjacent counts of memory cells,
calculating relative differences at least between the count differences adjacent to the smallest count difference and the smallest count difference,
extrapolating an extrapolated level between the relative differences, and
determining the first read level offset value as a distance between the extrapolated level and the current read level signal of the memory region; and
wherein the measuring and determining occurs internal to a memory component comprising the memory region.

20. A non-transitory computer readable medium having instructions stored thereon that, upon execution by a computing device, cause the computing device to perform operations, wherein the instructions comprise:
instructions to measure, for a portion of a memory region, first performance characteristics for each of a first plurality of read level test signals comprising a first base read level test signal;
instructions to determine a first read level offset value corresponding to one or more of the first plurality of read level test signals based on the measured first performance characteristics;
instructions to determine, based on the first read level offset value, a second base read level test signal;
instructions to measure, for the portion of the memory region, second performance characteristics for each of a second plurality of read level test signals comprising the second base read level test signal; and
instructions to determine a second read level offset value corresponding to one or more of the second plurality of read level test signals based on the measured second performance characteristics.

* * * * *